United States Patent
Lwali et al.

(10) Patent No.: US 10,689,200 B1
(45) Date of Patent: Jun. 23, 2020

(54) SORTING SYSTEM THAT TRANSFERS PAYLOADS FROM A CONVEYOR SYSTEM ONTO MOBILE DRIVE UNITS WITHOUT THE CONVEYOR SYSTEM KNOWING DESTINATIONS OF THE MOBILE DRIVE UNITS

(71) Applicant: Amazon Technologies, Inc., Seattle, WA (US)

(72) Inventors: Racha Lwali, Tacoma, WA (US); Andrew Gawne, Renton, WA (US); Bruce Leardi, Kirkland, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/145,950

(22) Filed: Sep. 28, 2018

(51) Int. Cl.
| | |
|---|---|
| *B65G 17/34* | (2006.01) |
| *B65G 47/48* | (2006.01) |
| *B65G 47/50* | (2006.01) |
| *B65G 47/49* | (2006.01) |
| *G05B 13/00* | (2006.01) |
| *H01L 21/67* | (2006.01) |
| *G05D 1/02* | (2020.01) |
| *B65G 43/08* | (2006.01) |
| *B66F 9/06* | (2006.01) |

(52) U.S. Cl.
CPC ......... *B65G 17/345* (2013.01); *B65G 47/485* (2013.01); *B65G 47/493* (2013.01); *B65G 47/503* (2013.01); *B65G 43/08* (2013.01); *B65G 2201/02* (2013.01); *B66F 9/063* (2013.01); *G05B 13/00* (2013.01); *G05D 1/0234* (2013.01); *G05D 2201/0216* (2013.01); *H01L 21/67271* (2013.01)

(58) Field of Classification Search
CPC ...... B65G 17/345; B65G 43/08; B65G 47/48; B65G 47/485; B65G 47/493; B65G 47/50; B65G 47/503; B65G 47/506; B65G 2201/02; B66F 9/063; G05B 13/00; G05D 1/0234; G05D 2201/0216; H01L 21/67271

See application file for complete search history.

(56) References Cited

U.S. PATENT DOCUMENTS

| | | | |
|---|---|---|---|
| 3,735,853 A | 5/1973 | Lingg et al. | |
| 6,044,957 A | 4/2000 | Guttinger | |
| 6,976,572 B2 | 12/2005 | Beck et al. | |

(Continued)

OTHER PUBLICATIONS

"Watch an army of robots efficiently sorting hundreds of parcels per hour"; https://www.youtube.com/watch?v=jwu9SX3YPSk; YouTube; Nov. 2017; accessed Nov. 1, 2018; 3 pages.

(Continued)

*Primary Examiner* — Mark A Deuble
(74) *Attorney, Agent, or Firm* — BakerHostetler

(57) ABSTRACT

In one embodiment, a sortation system at a facility has a conveyor system and a mobile drive unit system. The conveyor system has a conveyor surface that transfers payloads to the mobile drive units, and a controller that communicates a payload identifier for each payload to the mobile drive unit system. The payload identifiers are masked such that information about the local destinations are unknown to the conveyor system. The mobile drive unit system determines the local destinations from the payload identifiers by unmasking the payload identifiers, and delivers the payloads to determined local destinations at the facility.

20 Claims, 8 Drawing Sheets

(56) References Cited

U.S. PATENT DOCUMENTS

| | | | |
|---|---|---|---|
| 9,934,389 B2* | 4/2018 | Paterra | G06F 21/606 |
| 2001/0047922 A1 | 12/2001 | Meyer | |
| 2006/0173896 A1* | 8/2006 | Lyon | G06Q 10/08 |
| 2011/0274275 A1* | 11/2011 | Seitz | G06Q 10/08 |
| | | | 380/270 |
| 2014/0034456 A1* | 2/2014 | Gehring | B65G 43/08 |
| | | | 198/810.01 |
| 2014/0201094 A1* | 7/2014 | Herrington | G06K 9/00577 |
| | | | 705/317 |
| 2016/0011224 A1* | 1/2016 | Pollack | G01N 35/04 |
| | | | 700/230 |
| 2017/0178069 A1* | 6/2017 | Paterra | G06Q 10/0832 |
| 2017/0200248 A1 | 7/2017 | Murphy | |
| 2019/0028719 A1* | 1/2019 | Simpson | H04N 19/182 |
| 2019/0135551 A1* | 5/2019 | Sekich | B65G 43/00 |
| 2019/0135555 A1 | 5/2019 | Wagner et al. | |

OTHER PUBLICATIONS

"FLEET: future proofing baggage logistics"; https://www.youtube.com/watch?v=WeuFzRY6F2w; YouTube; Oct. 2017; accessed Nov. 1, 2018; 3 pages.

International Patent Application No. PCT/US2019/053440; Int'l Search Report and the Written Opinion; dated Feb. 6, 2020; 15 pages.

* cited by examiner

US 10,689,200 B1

SORTING SYSTEM THAT TRANSFERS PAYLOADS FROM A CONVEYOR SYSTEM ONTO MOBILE DRIVE UNITS WITHOUT THE CONVEYOR SYSTEM KNOWING DESTINATIONS OF THE MOBILE DRIVE UNITS

BACKGROUND

Movement of products in a modern warehouse environment, such as but not limited to a package sort center, in which packages are moved within a facility, occurs on a vast scale. One method of sorting packages (i.e., payloads) includes using mobile drive units to deliver packages to local destinations at the facility that correspond the ultimate final destination of the package outside of the facility such as a customer address. For example, mobile drive units can be used to organize packages based on delivery route, as determined based on a postal code or other package features. Mobile drive units are self-powered robotic devices that travel on the floor of the warehouse guided by, for example, fiducial markers in or on the floor. In this manner, mobile drive units may follow a grid-like pattern to traverse from a starting point to a destination point, such as a drop-off location for a package.

BRIEF DESCRIPTION OF THE DRAWINGS

The following detailed description will be better understood when read in conjunction with the appended drawings, in which there is shown in the drawings example embodiments for the purposes of illustration. It should be understood, however, that the present disclosure is not limited to the precise arrangements and instrumentalities shown. In the drawings.

DETAILED DESCRIPTION

Figure 1:
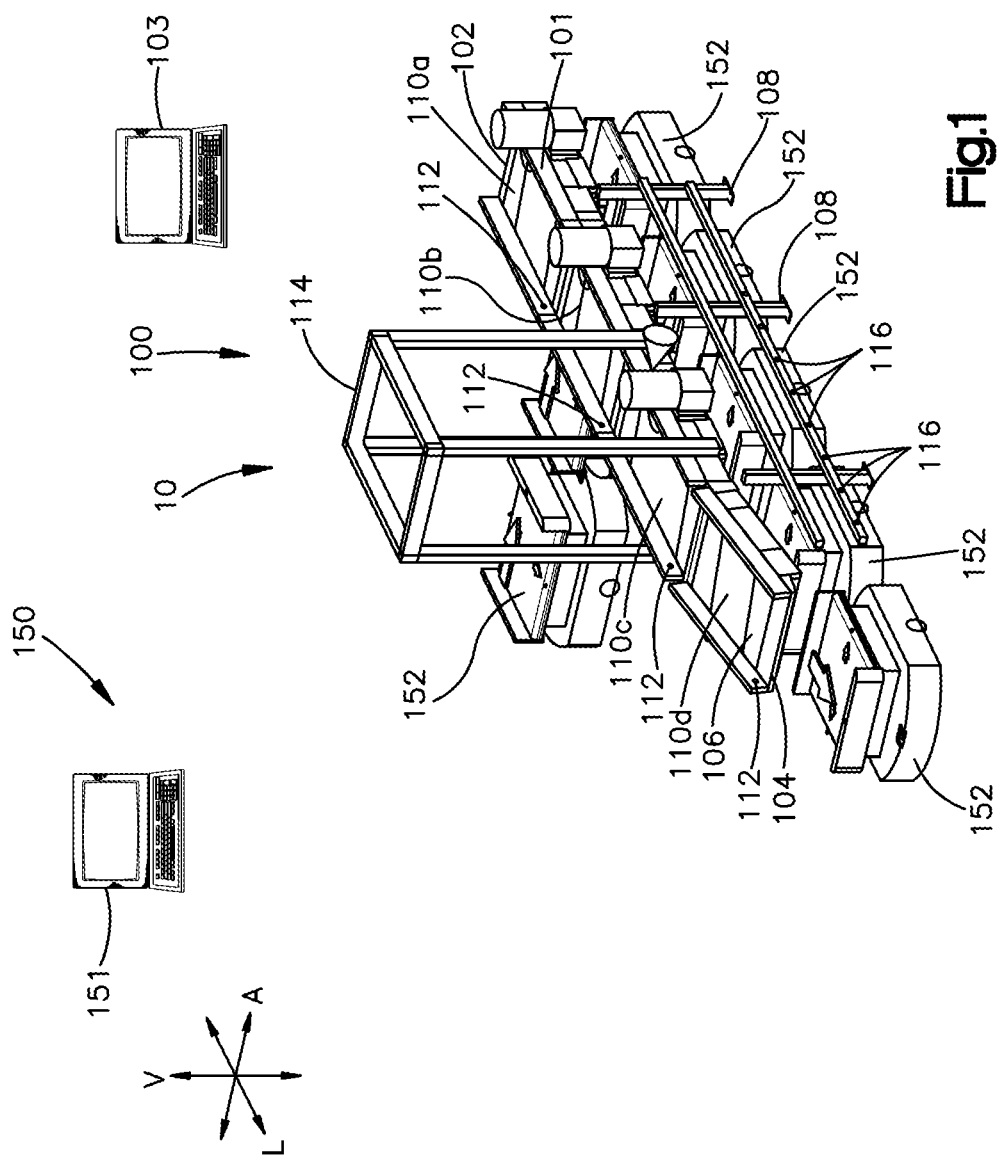
FIG. 1 shows a perspective view of a sortation system according to one embodiment.

Referring to FIG. 1, a sortation system 10 is shown that comprises a conveyor system 100 and a mobile drive unit system 150. The sortation system 10 can be implemented at a facility such as (without limitation) a package sortation facility. In general, the conveyor system 100 comprises a conveyor controller 103, and a conveyor 101 having a conveyor surface 106 controlled by the conveyor controller 103. The mobile drive unit system 150 comprises a drive unit controller 151, and a plurality of mobile drive units 152 that communicate with the drive unit controller 151. The conveyor system 100 transfers payloads to mobile drive units 152 of the mobile drive unit system 150 as the mobile drive units 152 move out from underneath a conveyor surface 106 of the conveyor system 100. The term "payload" is used herein to refer to any object typically moved in commerce, including but not limited to objects to be packed for delivery, boxes, envelopes (such as jiffy mailers or bubble packs), containerized or bagged objects or packages, and the so on. In one example, the payloads can be packages that are to be delivered to customers at remote destinations such as customers' mailing addresses.

The conveyor system 100 and the mobile drive unit system 150 can be separately designed systems that are designed to be operated independently of one another. For example, the two systems 100 and 150 can be manufactured by separate entities. Therefore, when the systems 100 and 150 are used together as shown in FIG. 1, communication between the conveyor system 100 and the mobile drive unit system 150 may be established to ensure proper transfers of payloads to the mobile drive units 152. However, as will be described below, some information, such as speeds and positions of the mobile drive units 152 might not be known by the mobile drive unit system 100, and therefore, cannot be communicated to the conveyor system 100 for timing of the transfers. Therefore, the conveyor system 100 can include sensors that detect the speeds and positions of the mobile drive units 152 as they move underneath the conveyor surface 106. Based on the detected speeds and positions, the conveyor system 100 can control the timing and the speed of the conveyor surface 106 so as to ensure that the payloads are properly transferred from the conveyor surface 106 to the mobile drive units 152.

Once transferred to the mobile drive units 152, the mobile drive units 152 sort the payloads by moving the payloads to different local destinations at the facility. Each local destination at the facility can correspond to one of the remote destinations or a set of the remote destinations. For example, each remote destination can correspond to a postal code or a set of postal codes, and the packages can subsequently be shipped from the local destinations to the remote destinations. As used herein, the term "local" refers to locations at the facility at which the sortation system 10 is implemented, and the term "remote" refers to locations away from or external to the facility.

The local destinations, the layout of the facility, and/or any customer information such as the remote destinations may be proprietary information to the facility owner/operator. Further, the owner/operator of the facility might wish to prevent this proprietary information from being communicated to the conveyor controller 103 or from being communicated to the manufacturer of the conveyor controller 103 in the event that the manufacturer of the conveyor system 100 is an entity other than the facility operator/owner. Therefore, the sortation system 10 can be configured such that the local destinations, the routing of the mobile drive units 152, and/or the customer information are not known by, and are not transferred to, the conveyor system 100. Rather, the mobile drive unit system 150 can receive payload identifiers from the conveyor system 106, and determine the local destinations from the payload identifiers without communicating the local destinations to the conveyor system 100. Thus, it can be said that the local destinations are masked or hidden from the conveyor system 106 by the payload identifiers.

Figure 2:
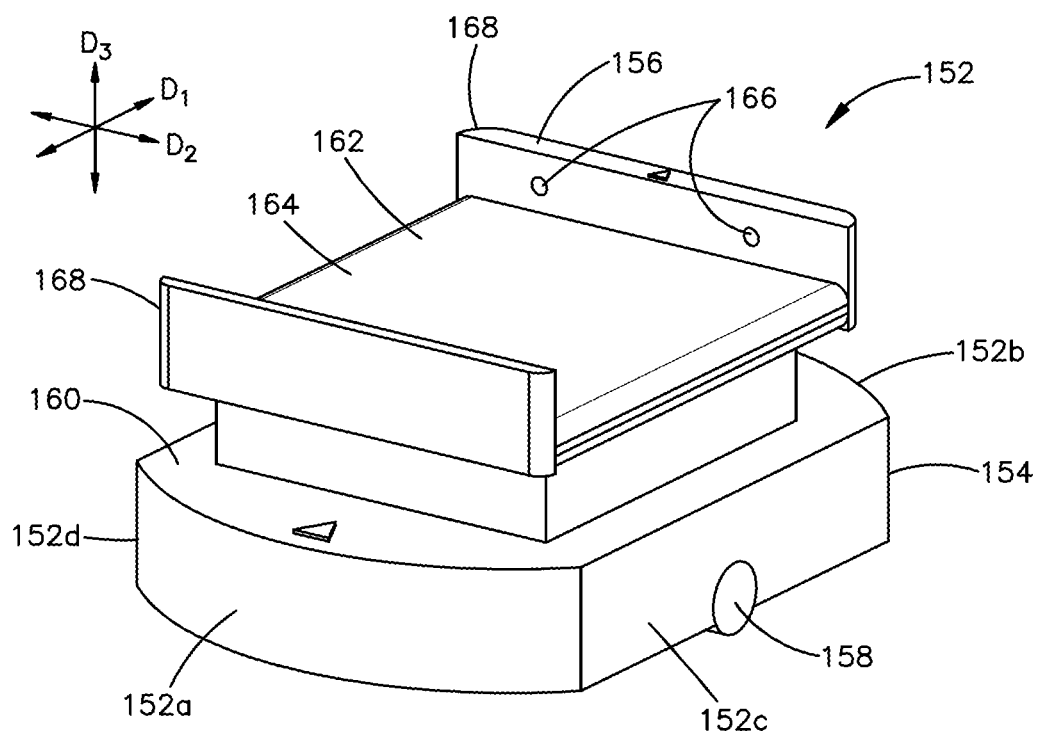
FIG. 2 shows a perspective view of a mobile drive unit according to one embodiment.

Referring to FIG. 2, each mobile drive unit 152 can be an autonomous or semi-autonomous robot that travels on a floor of the warehouse guided by, for example, fiducial markers in or on the floor. In this manner, mobile drive units 152 may follow a grid-like pattern to traverse from a starting point to a destination point, such as a drop-off location for a package. Each mobile drive unit 152 can include a first end 152a and a second end 152b that are spaced from one another along a first direction D1. Each mobile drive unit 152 can include a first side 152c and a second side 152d that are spaced from one another along a second direction D2, which is perpendicular to the first direction D1. Each mobile drive unit 152 can include and upper end 152e and a lower end 152f that are spaced from one another along a third direction D3, which is perpendicular to the first direction D1 and the second direction D2. The third direction D3 can be a vertical direction.

Each mobile drive unit 152 includes a vehicle chassis 154. Each chassis 154 supports a payload carrier 156 that is configured to carry a package (or other payload) thereon. The chassis 154 includes at least one pair of wheels 158. Each mobile drive unit 150 can include a motor (not shown) that is configured to drive at least one of the wheels 158 in response to control signals so as to rotate the at least one of the wheels 158, thereby causing the mobile drive unit 150 to move along a floor. The wheels 158 can be driven at the same speed as one another so as to move the mobile drive unit 150 forward or backward along the first direction D1. The speed and/or direction of at least one of the wheels 158 can be varied from that of the other wheel or wheels 158 so as to cause the mobile drive unit 150 to rotate in place or turn. Optionally, the chassis 154 can also include one or more casters (not shown) that are configured to contact the floor under the mobile drive unit 150.

The wheels 158 of each pair can be spaced opposite from one another along the second direction D2, such as at opposite sides 152c and 152d of the chassis 154, or can be disposed at any other suitable location of the chassis 154. In one example as shown, the chassis 154 can include a single pair of wheels 158 that are at approximately a midpoint of the mobile drive unit 150 between the first and second ends 152a and 152 be with respect to the first direction D1. Each mobile drive unit 150 can include a cover 160 that is affixed to the chassis 154. The cover 160 can have cut-out portions that form wheel cut-outs for the wheels 158 to extend therethrough.

The payload carrier 156 of each mobile drive unit 150 can include a conveyor system 162. The conveyor system 162 can include a conveyor surface 164 that can be defined by at least one such as a plurality of rotating conveyor elements. The rotating conveyor elements can include a conveyor belt, wire mesh, one or more rollers or balls, any other suitable rotating conveyor element, or any suitable combination of rotating conveyor elements. The conveyor surface 164 can be configured to rotate relative to the chassis 154 so as to move payloads supported thereon along the second direction D2. However, it will be understood that in alternative embodiments, the conveyor surface 164 can be configured to move payloads along the first direction D1.

The conveyor system 162 can include one or more sensors 166, such as (without limitation) photo-eyes or light curtains, that are configured to detect the presence and/or location of payloads on conveyor surface 164. The number of sensors 166 can be selected based on variability of the speed of the mobile drive units. Rotation of the conveyor elements can be controlled based on the whether or not a payload is detected on the conveyor surface 164. For example, rotation of the conveyor elements can be stopped when the one or more sensors 166 detect that a payload has been received on the conveyor surface 164. The mobile drive unit 152 can further rotate the conveyor surface 164 so as to reposition the payload on the conveyor surface 164 in the event that the sensors 166 detect that the payload is hanging off of the conveyor surface 164. Optionally, the conveyor system 162 can include sidewalls 168 that extend vertically upwards relative to the conveyor surface 164 so as to prevent payloads from falling off the ends 152a and 152b of the mobile drive unit 150 during transport.

Figure 4:
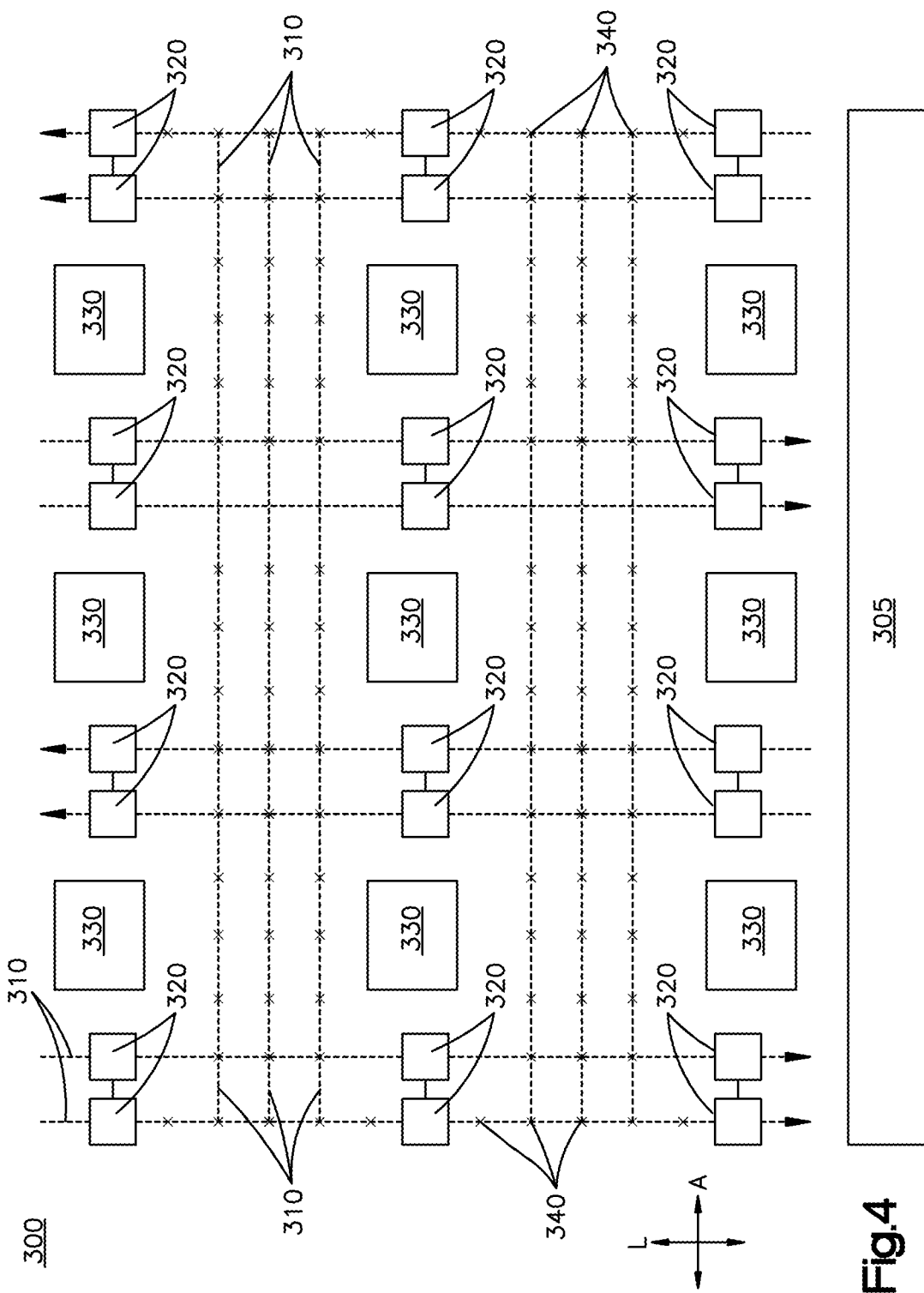
FIG. 4 shows a simplified schematic diagram of an example floor map of a facility showing a routing pattern for mobile drive units to travel to a plurality of local destinations.

Turning briefly to FIG. 4, a floor plan 300 is shown of a routing pattern for the mobile drive units 152 in a facility, such as a sortation center. The floor plan 300 includes an induction station 305, a plurality of fiducial markers 340, a plurality of ejection points 320, and a plurality of local destinations 330. Each fiducial marker 340 is a marker that is disposed on, or embedded in, the floor. Each fiducial marker 340 represents a decision point for the mobile drive units 152, wherein a decision is made for the mobile drive units to continue straight, turn left, turn right, or turn completely around by 180 degrees. The plurality of fiducial markers 340 are spaced from one another so as to form a grid of fiducial markers 340. For example, the fiducial markers 340 can include a plurality of first sets of fiducial markers 340, where the fiducial markers in each first set are offset from, and aligned with, one another along a longitudinal direction L. Each first set of fiducial markers 340 can define a travel lane 310 that extends along the longitudinal direction L. Further, the fiducial markers 340 can include a plurality of second sets of fiducial markers 340, where the fiducial markers in each second set are offset from, and aligned with, one another along a lateral direction A, perpendicular to the longitudinal direction L. Each second set of fiducial markers 340 can define a travel lane 310 that extends along the lateral direction A. Note that the travel lanes 310 can be imaginary lines that are defined by connecting fiducial markers 340, rather than actual lines that are disposed on the floor.

The mobile drive units 152 enter the travel lanes 310 from the induction station 305 and travel along the travel lanes to the ejection points 320. Thus, the travel lanes 310 define pathways to the ejection points 320, which are disposed adjacent to local destinations 330. The mobile drive units 152 are configured to travel along the travel lanes 310 to the ejection points 320, and then, once positioned at the ejection points 320, to eject their respective payloads to the local destinations 330.

The induction station 305 can include one or more of the induction conveyor systems 100, spaced from one another along a lateral direction. The induction station 305 can be a waypoint for the mobile drive units 152 to enter the travel lanes 310 after recharging, after being loaded with a payload to be delivered to a particular local destination 330, or the like. For example, the mobile drive units 152 can begin and end each delivery at the induction station 305.

In one example, the local destinations 330 can be chutes that extend downwardly from the floor. In other examples, the local destinations 330 can be conveyors, pallets, or other suitable depositories for receiving the payloads of the mobile drive units 152. As described above, each local destination 330 can corresponding with a remote destination such as a customer address or postal code.

Floor plans of the present disclosure are not limited to the particular configuration shown in the floor map 300 of FIG. 4. Thus, while the floor plan 300 shows only the induction station 305, the travel lanes 310, the ejection points 320, and the local destinations 330, other configurations are possible that may include other elements, including obstacles, mobile drive unit loading mechanisms, or the like. Further, while travel lanes 310 are all straight lanes, and every intersection is comprised of two straight travel lanes 310 intersecting at 90 degrees, implementation of this technology is not limited to this particular map 300. For example, other maps 300 can incorporate different path arrangements, including but not limited to curved travel lanes, intersections having different angles, and intersections having different number of lanes 310 intersecting. Further, traffic lanes 310 are shown as all existing in the same plane. However, it is contemplated that this technology may be used to control traffic traveling across nonplanar surfaces and even three-dimensional travel.

The mobile drive units 152 are configured to travel along the travel lanes 310 by detecting and following the fiducial markers 340, communicating with the drive unit controller 151, and communicating with other mobile drive units 152. The drive unit controller 151 can provide information such as a local destination 330 to each mobile drive unit 152 to which its payload is to be delivered. Moreover, the drive unit controller 151 can provide instructions to each mobile drive unit 152 for navigating to a corresponding one of the local destinations 330. In one example, the drive unit controller 151 can communicate instructions to the mobile drive units 152 one out of every few (e.g., three) fiducial markers 340 that the mobile drive units 152 encounters. For instance, the drive unit controller 151 may provide a preferred route to a mobile drive unit 152 when the mobile drive unit 152 encounters every third fiducial marker 340. The instructions can include instructions to travel straight to the next fiducial marker 340, to turn right, to turn left, or to turn around.

The mobile drive unit 152 can also make its own decisions as to which route to take based on communicates with other mobile drive units 152. Thus, each mobile drive unit 152 can determine its own path between several of the fiducial markers 340 (e.g., between every third marker) so as to avoid collisions with other mobile drive units 152 or other obstacles. Information about the position of each mobile drive unit 152 might be communicated to the drive unit controller 151 only every several fiducial markers 340 (e.g., every third marker), so the drive unit controller 151 might not be aware of a position or speed of the mobile drive units 152 between several fiducial markers 340 (e.g., between every third marker). As a result, the position and speed of each mobile drive unit 152 as it travels under the conveyor surface 106 is not known by the drive unit controller 151, and therefore, cannot be communicated by the drive unit controller 151 to the conveyor controller 103. This information can instead be detected by sensors of the conveyor system 100 as will be described in further detail below.

Returning to FIG. 1, the conveyor system 100 comprises a conveyor 101 that has a first conveyor end 102 and a second conveyor end 104 that are offset from one another. In one example as shown, the first and second conveyor ends 102 and 104 can be offset from one another along a straight, longitudinal direction L. However, it will be understood that, in alternative embodiments, the conveyor system 100 need not be straight. The conveyor system 100 has a conveyor surface 106 configured to carry payloads from the first conveyor end 102 to the second conveyor end 104. The conveyor surface 106 can be defined by at least one rotating conveyor element. The at least one rotating conveyor element can include a conveyor belt, wire mesh, one or more rollers or balls, any other suitable rotating conveyor element, or any suitable combination of rotating conveyor elements. In one example, the second conveyor end 104 can include a knife edge.

The conveyor system 100 has support structure 108 that is configured to support the conveyor surface 106 above a floor so as to define a space between the conveyor surface 106 and the floor. The space is sized such that the mobile drive units 152 can drive under the conveyor surface 106 towards the second end 104 of the conveyor system 100. For example, the mobile drive units 152 can drive under the conveyor surface 106 along the longitudinal direction L.

The conveyor 101 can comprise at least one conveyor segment, such as a plurality of conveyor segments. Each conveyor segment can define a different portion of the conveyor surface 106. In the example shown, the conveyor system 100 comprises four conveyor segments 110a, 110b, 110c, and 110d. Further, the conveyor segments are offset from one another between the first and second conveyor ends 102 and 104, such as along the longitudinal direction L. It will be understood that, in alternative examples, the conveyor 101 can include as few one conveyor segment or any suitable number of conveyor segments. The conveyor segments 110a, 110b, 110c, and 110d can be separately operable so as to separate payloads supported by the conveyor surface 106. For example, the conveyor surface 106 at a downstream one of the conveyor segments (e.g., 110b) can be operated so as to separate a payload supported by the downstream one of the conveyor segments from a payload supported by an upstream one of the conveyor segments (e.g., 110a).

The conveyor system 100 can include a plurality of sensors 112, such as (without limitation) photo-eyes or light curtains, that are configured and positioned to detect the presence and/or location of payloads on the conveyor surface 106 at each conveyor segment 110a, 110b, 110c, and 110d. Thus, the sensors 112 can be offset from one another along a direction that extends from the first end 102 to the second end 104 of the conveyor 101. Further, the sensors 112 can be aligned with or above the conveyor surface 106. Rotation of the conveyor elements of the conveyor segments can be controlled based on the whether or not a payload is detected on the conveyor segment and based on how close a payload is to another payload. For example, when the sensors 112 detect two payloads that are too close to one another, the conveyor elements of at least one of the conveyor segments 110a, 110b, 110c, and 110d can be rotated to separate the payloads.

The conveyor system 100 can include at least one scanner 114 that is configured and positioned to scan the payloads as the payloads are carried by the conveyor surface 106. The at least one scanner 114 is configured to read payload identifiers on the payloads. In one example, the payloads can include barcodes, and the scanner 114 can be configured to read the barcodes to determine the payload identifiers. However, it will be understood that payload identifiers other than barcodes can be used. Each payload identifier can be a unique identifier that differentiates each payload from the other payloads. Each payload identifier can be a generic identifier that does not include any proprietary information such as the local destinations, the routing of the mobile drive units 152, or customer information such as customer addresses. Thus, the proprietary information can be masked or hidden from the conveyor system 100, and later determined by the drive unit controller 151. The masking can be performed using any suitable masking technique including (without limitation) substitution, encoding, encryption, shuffling of values, and/or nulling out of values.

The conveyor system 100 can include at least one sensor 116, such as a plurality of sensors 116, that are configured and positioned to detect a speed and position of the mobile drive units 152 as the mobile drive units 152 move under the conveyor surface 106. In one example, each sensor 116 can be a photo-eye or light curtain. The sensors 116 can be offset from one another along a direction that extends from the first end 102 to the second end 104 of the conveyor 101 so as to define a synchronization zone wherein the sensors 116 track the position and speed of the mobile drive units. For example, the sensors 116 can be offset from one another along the longitudinal direction L. Further, the sensors 112 can be aligned with the mobile drive units 152 below the conveyor surface 106. In one example, the sensors 116 can be supported by the support structure 108.

Figure 3:
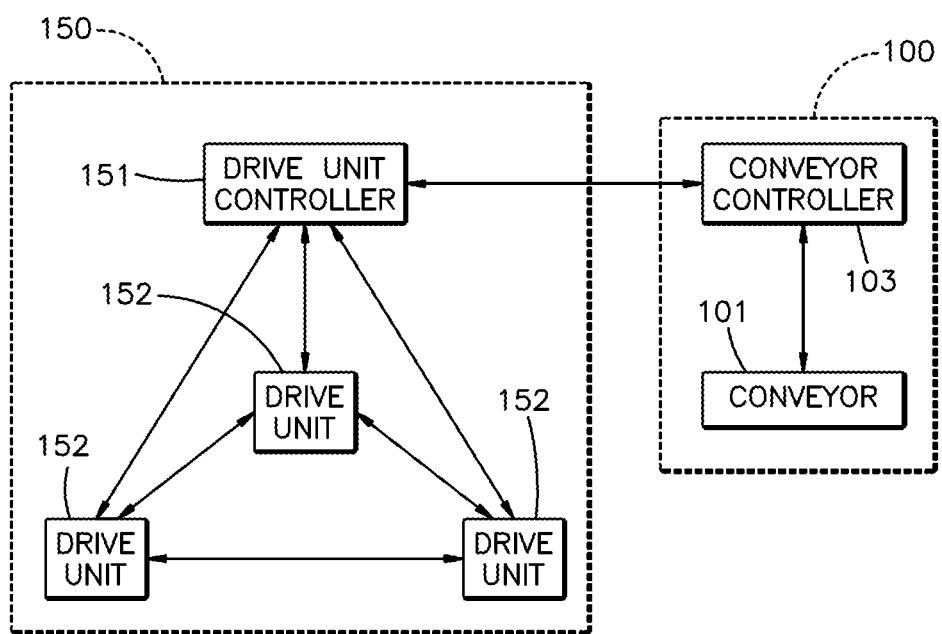
FIG. 3 shows a simplified block diagram of a sortation system according to one embodiment.

Turning briefly to FIG. 3, the conveyor controller 103 is configured to communicate with the conveyor 101 so as to control the operation of the conveyor 101 such as movement of the conveyor surface 106 of the conveyor 101. The drive unit controller 151 is configured to communicate with the mobile drive units 152 so as to control movement of the mobile drive units 152 around the facility. For example, the drive unit controller 151 can provide information such as local destinations to the mobile drive units 152 to which an payload is to be delivered. The mobile drive units 152 in turn can be configured to communicate with one another and with the drive unit controller 151 to move around the facility and to avoid collisions with other mobile drive units 152. In one example, the mobile drive units 152 may communicate with the drive unit controller 151 every few (e.g., three) fiducial markers as described above. The drive unit controller 151 can be configured to communicate certain information to the conveyor controller 103 such as identifiers of the mobile drive units 152, but does not communicate destination information, routing information, and/or customer information to the conveyor controller 103. The drive unit controller 151 additionally does not communicate speed or position of the mobile drive units 152 to the conveyor controller 103. The conveyor controller 103 can be configured to communicate certain information to the drive unit controller 151 such as payload identifiers and when a payload is ready for transfer to a mobile drive unit 152.

The conveyor controller 103 can include a computing device having a processor, memory, an executable program, and a communications device that is configured to communicate with the conveyor 101 and the mobile drive unit system 150. Similarly, the drive unit controller 151 can include a computing device having a processor, memory, an executable program, and a communications device that is configured to communicate with the mobile drive units 152 and the conveyor system 100. Although FIG. 1 shows the controllers 103 and 151 as computers with monitors, embodiments of the disclosure are not so limited. In alternative embodiments, the controllers 103 and 151 can each be implemented as a programmable logic controller, microcontroller, or any other suitable type of controller or controllers.

Figure 5:
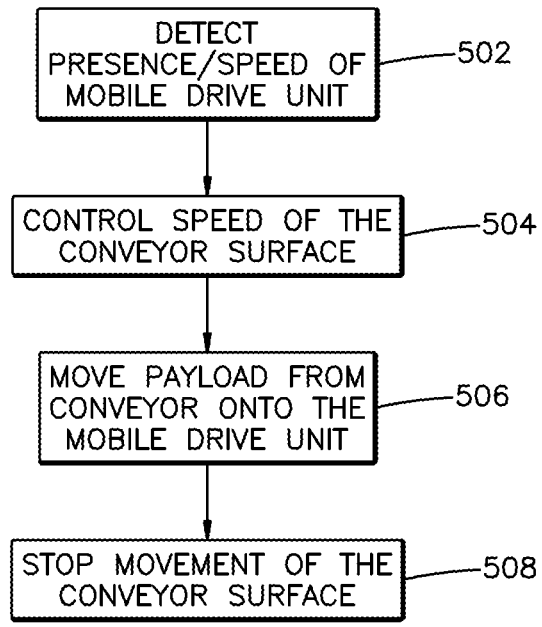
FIG. 5 shows a simplified block diagram of a method of operating the conveyor system of the sortation system of FIG. 1 according to one embodiment.

Turning to FIG. 5, a method of operating the conveyor system 100 of the sorting system 10 of FIG. 1 is shown. In step 502, the sensors 116 of the conveyor system 100 detect positions and speed of a mobile drive unit 152 moving under the conveyor surface 106. In step 504, the conveyor system 100 moves at least a portion of the conveyor surface 106 when the sensors 116 detect the positions and/or speed of the move drive so as to move the payload from the conveyor surface 106 to the mobile drive unit 152. In one example, the sensors 116 can be configured to detect speed. In another example, the sensors 116 can be configured to detect positions of the mobile drive unit 152 at various times, and conveyor system 100 can be configured to calculate speed of the mobile drive unit 152. The conveyor controller 103 uses the detected position and speed information to synchronize movement of the conveyor surface 106 with the mobile drive unit 152 so that the payload can be transferred to the mobile drive unit 152. For example, the conveyor system 100 can be configured to determine a time when the mobile drive unit will move out from under the second end based on the speed. The conveyor system 100 can further be configured to start movement of at least a portion of the conveyor surface 106 based on the determined time so as to move the payload onto the mobile drive unit 152. The portion of the conveyor surface 106 that is started can be a portion at the second conveyor end 104, such as segment 110d.

The conveyor system 100 can be configured to adjust the speed of the conveyor surface 106 based on the speed of the mobile drive unit 152 in step 504. The speed can be increased or decreased based on the speed of the mobile drive unit 152. Preferably, the speed of the conveyor surface 106 is controlled such that the friction between the payloads and the conveyor surface 106 causes the payloads move with the conveyor surface 106 and at the speed of the conveyor surface 106. Preferably, the conveyor surface 106 is not accelerated in such a manner that the friction between the payloads and conveyor surface 106 is overcome, thereby causing the conveyor surface 106 to slip under the payloads, possibly tossing the packages about. This speed/acceleration can depend upon, for example, weight of the packages and communication latency between the conveyor system 100 and drive unit system 150. Preferably, movement of the conveyor surface 106 is started before a mobile drive unit 152 reaches the end of the conveyor surface 106. Otherwise, acceleration of the conveyor surface 106 to transfer a payload to the mobile drive unit 152 may need to be so great that the friction between the payload and conveyor surface 106 is overcome. While the conveyor surface 106 is moving, the payload is moved from the conveyor surface 106 to the mobile drive unit 152 in step 506. The conveyor controller 103 can then stop movement of the conveyor surface 106 in step 508 after the payload is transferred.

Figure 6:
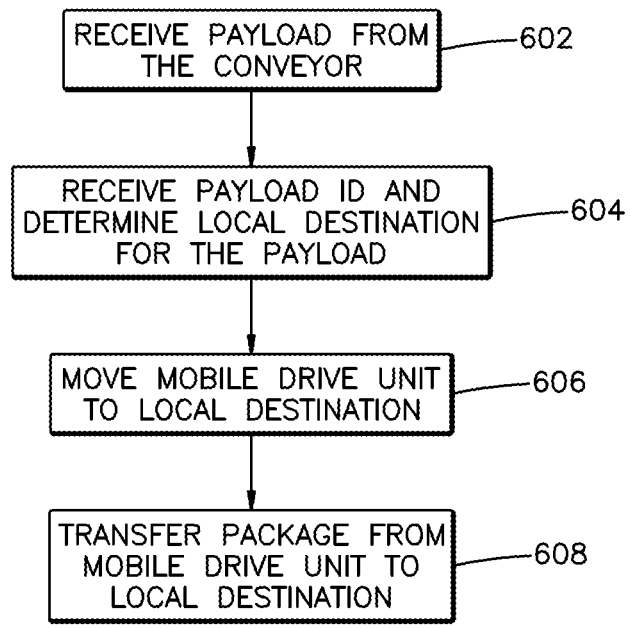
FIG. 6 shows a simplified block diagram of a method of operating the mobile drive unit system of the sortation system of FIGS. 1 and 9 according to one embodiment.

Turning to FIG. 6, a method of operating the mobile drive unit system 150 of FIG. 1 is shown. In step 602, the conveyor surface 162 of a mobile drive unit 152 receives a payload from the conveyor system 100. To receive the payload, the mobile drive unit 152 drives under the conveyor surface 106 by following fiducial markers under the conveyor surface 106. For example, the mobile drive unit 152 can approach the conveyor surface 106 from the side by following fiducial markers, and then turn at a fiducial marker under the conveyor surface 106 as shown in FIG. 1. The mobile drive unit 152 can then follow fiducial markers that are directly under the conveyor surface 106. Alternatively, the mobile drive units 152 can take paths other than that shown in FIG. 1. For example, the mobile drive units 152 can drive under the conveyor surface 106 at two different locations between the first and second conveyor ends 102 and 104 such that some of the mobile drive units 152 turn at a first position under the conveyor surface 106 and other mobile drive units 152 turn at a second position under the conveyor surface 106 that is downstream of the first position.

In step 604, the drive unit controller 151 receives a payload identifier from the conveyor system 100, and determines a local destination to which the payload is to be delivered. In other words, the drive unit controller 151 can unmask the local destination information. In one example where the data is masked using by substituting the local destination information for other information, the local destination information can be determined by looking up the local destination in a table based on the payload identifier. In one example where the local destination information is masked by encoding, the local destination can be determined by decoding the encoded payload identifier. In one example where the local destination information is masked by encryption, the local destination can be determined by decrypting the encrypted payload identifier. It will be understood that other suitable masking and unmasking techniques can be used. In step 606, the drive unit controller 151 communicates the local destination to the mobile drive unit 152, and the mobile drive unit 152 moves to the local destination. In step 608, the mobile drive unit 152 discharges the payload from its conveyor surface 162 to the local destination.

Figure 7:
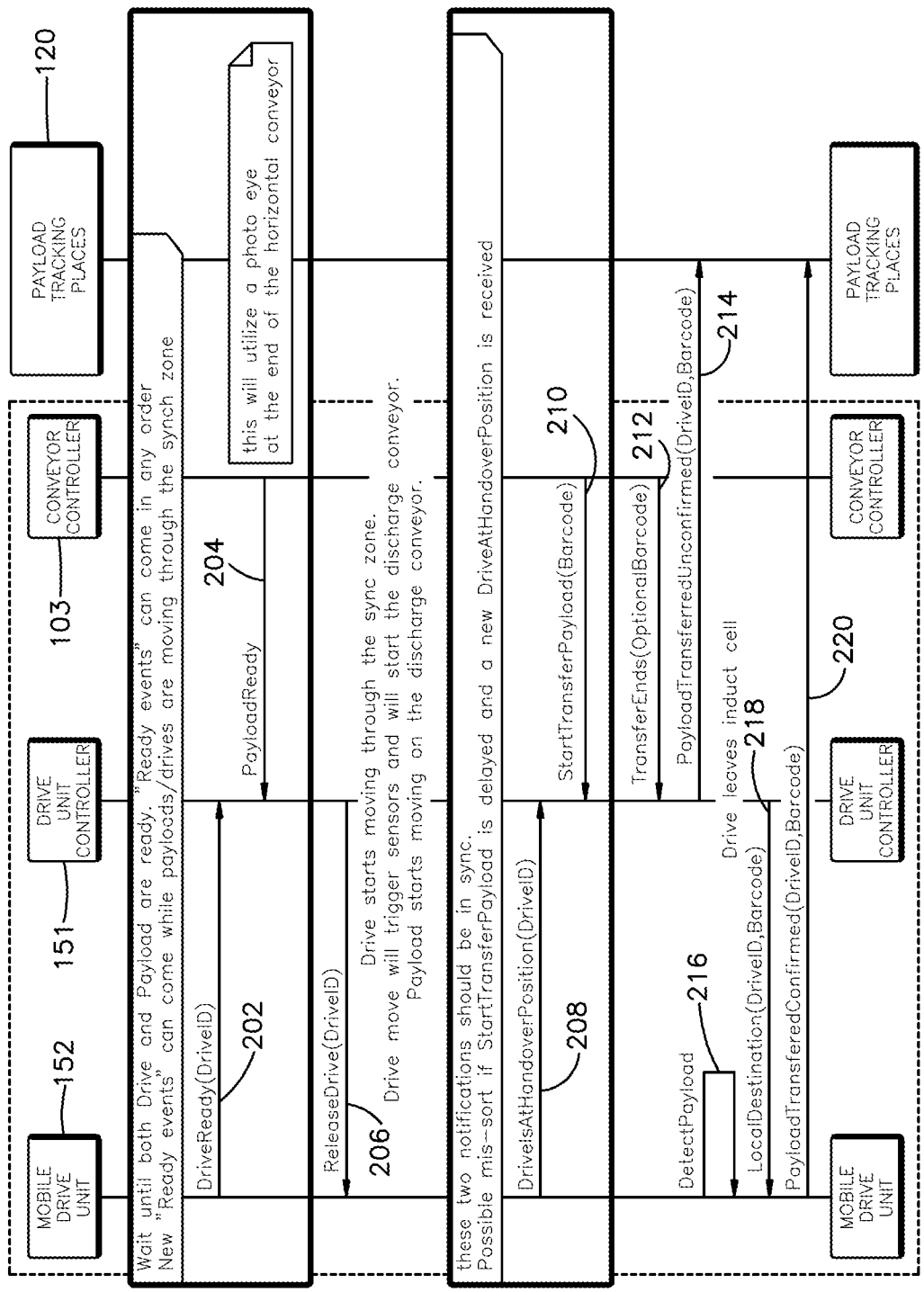
FIG. 7 shows a messaging diagram for the sortation system of FIG. 1 according to one embodiment, where a drive-payload association is maintained by the drive unit controller.

Turning now to FIG. 7, a messaging diagram for the system 10 of FIG. 1 is shown according to one embodiment. In FIG. 7, an association between each drive 152 and its respective payload is maintained by the drive unit controller 151, not by the conveyor controller 103. The sortation system 10 can wait until both a mobile drive unit 152 and a payload are ready for transfer. When a mobile drive unit 152 is positioned at a beginning of the synchronization zone defined by the sensors 116 of the conveyor system 100, the mobile drive unit 152 sends a drive ready signal 202 along with a drive identifier to the drive unit controller 151. When a payload is positioned adjacent the second end 104 of the conveyor 101, the conveyor controller sends a payload ready signal 204 to the drive unit controller 151. When both a payload and a mobile drive unit 152 are ready, the drive unit controller 151 sends a release drive signal 206 to the mobile drive unit 152, and the mobile drive unit 152 starts moving through the synchronization zone defined by the sensors 116 of the conveyor system 100.

When the mobile drive unit 152 is at the handover position, the mobile drive unit 152 sends a drive at handover position signal 208 to the drive unit controller 151. The conveyor controller 103 starts moving its conveyor surface 106, and sends a start transfer signal 210 to the drive unit controller 151 along with a payload identifier such as a barcode. Thus, at this point, the drive unit controller 151 associates the drive identifier with the payload identifier. As described above, each payload identifier can be a unique identifier that differentiates each payload from the other payloads. Each payload identifier can be a generic identifier that does not include any proprietary information such as customer information or addresses. Thus, it can be said that the local destinations are masked or hidden from the conveyor system 106 by the payload identifiers.

The conveyor controller 103 synchronizes the speed of the conveyor surface 106 with the speed of the mobile drive unit 152, and the conveyor surface 106 transfers the payload to the mobile drive unit 152. If the start transfer signal 210 is delayed, then the payload could be mistakenly transferred to a subsequent mobile drive unit 152, upon which the payload could be transferred to an incorrect local destination. Once the payload has been transferred, the conveyor controller 103 stops the conveyor surface 106 and sends a transfer end signal 212 to the drive unit controller 151. If the payload does not land on the mobile drive unit 152 or is out of position such that it cannot be scanned, then the drive unit controller 151 sends a transfer unconfirmed signal 214 to a payload tracking software or system 120.

Upon transfer of the payload, the mobile drive unit 152 detects the payload 216. Further, the drive unit controller 151 determines a local destination for the mobile drive unit 152 and payload, and sends the local destination 218 to the mobile drive unit 152. The mobile drive unit 152 moves to the local destination, and once the payload has been transferred to the local destination 218, the mobile drive unit 152 sends a payload transferred signal 220 to the payload tracking software or system 120.

Figure 8:
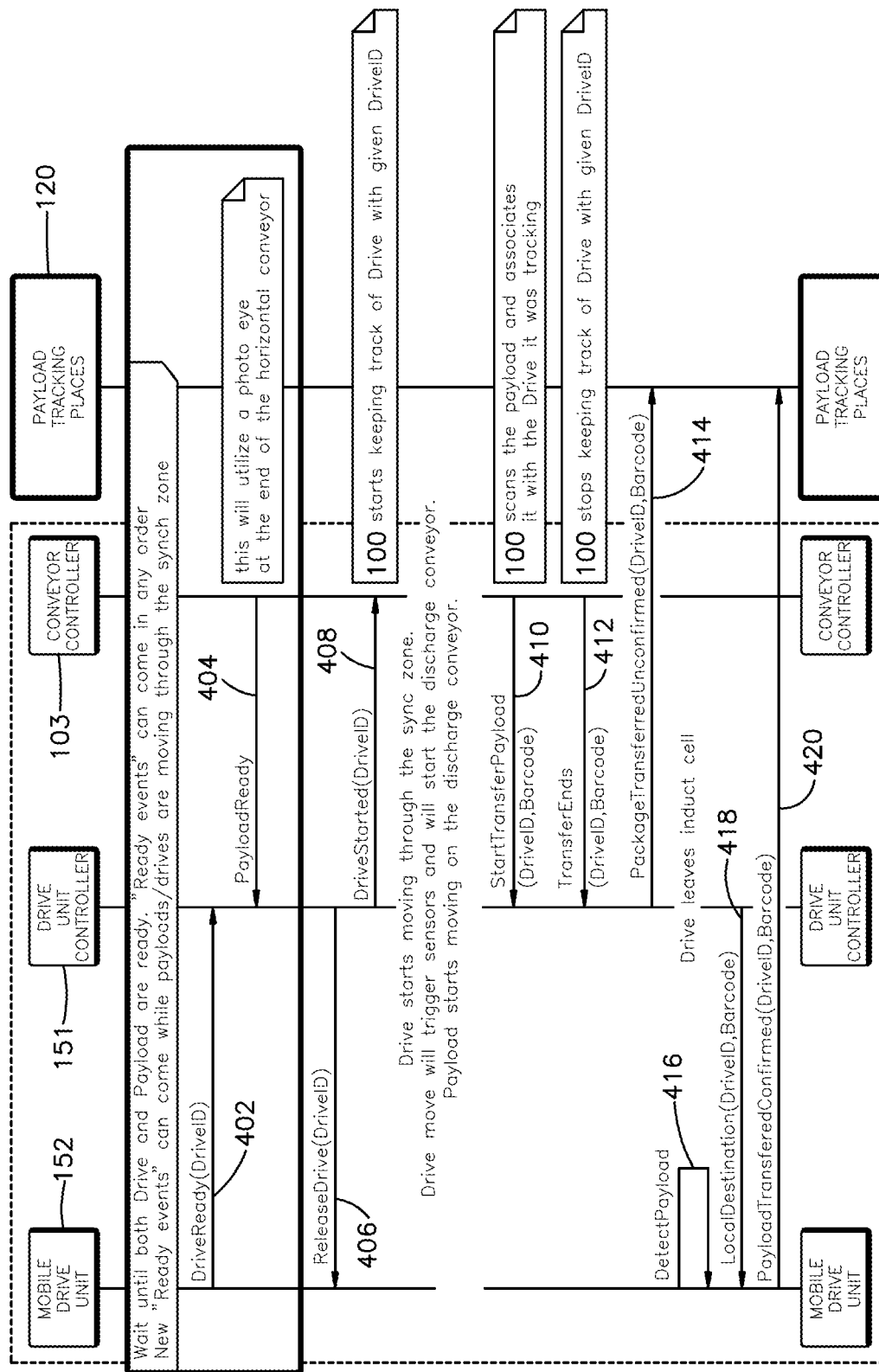
FIG. 8 shows a messaging diagram for the sortation system of FIG. 1 according to another embodiment, where a drive-payload association is maintained by the conveyor controller.

Turning to FIG. 8, a messaging diagram for the system 10 of FIG. 1 is shown according to another embodiment. In FIG. 8, an association between each drive 152 and its respective payload is maintained by the conveyor controller 103, not the drive unit controller 151. The sortation system 10 can wait until both a mobile drive unit 152 and a payload are ready for transfer. When a mobile drive unit 152 is positioned at a beginning of the synchronization zone defined by the sensors 116 of the conveyor system 100, the mobile drive unit 152 sends a drive ready signal 402 along with a drive identifier to the drive unit controller 151. When a payload is positioned adjacent the second end 104 of the conveyor 101, the conveyor controller sends a payload ready signal 404 to the drive unit controller 151. When both a payload and a mobile drive unit 152 are ready, the drive unit controller 151 sends a release drive signal 406 to the mobile drive unit 152, and a drive started signal 408 with drive identifier to the conveyor controller 103. The mobile drive unit 152 starts moving through the synchronization zone defined by the sensors 116 of the conveyor system 100, and the sensors 116 track the speed and position of the mobile drive unit 152.

Based on the speed and position of the mobile drive unit 152, the conveyor controller 103 starts moving its conveyor surface 106, and sends a start transfer signal 410 to the drive unit controller 151 along with a payload identifier such as a barcode. Thus, at this point, the drive identifier is associated with the payload identifier at the conveyor controller 103. As described above, each payload identifier can be a unique identifier that differentiates each payload from the other payloads. Each payload identifier can be a generic identifier that does not include any proprietary information such as customer information or addresses. Thus, it can be said that the local destinations are masked or hidden from the conveyor system 106 by the payload identifiers.

The conveyor controller 103 synchronizes the speed of the conveyor surface 106 with the speed of the mobile drive unit 152, and the conveyor surface 106 transfers the payload to the mobile drive unit 152. Once the payload has been transferred, the conveyor controller 103 stops the conveyor surface 106 and sends a transfer end signal 412 to the drive unit controller 151. If the payload does not land on the mobile drive unit 152 or is out of position such that it cannot be scanned, then the drive unit controller 151 sends a transfer unconfirmed signal 214 to a payload tracking software or system 120.

Upon transfer of the payload, the mobile drive unit 152 detects the payload 416. Further, the drive unit controller 151 determines a local destination for the mobile drive unit 152 and payload, and sends the local destination 418 to the mobile drive unit 152. The mobile drive unit 152 moves to the local destination, and once the payload has been transferred to the local destination, the mobile drive unit 152 sends a payload transferred signal 420 to the payload tracking software or system 120.

Figure 9:
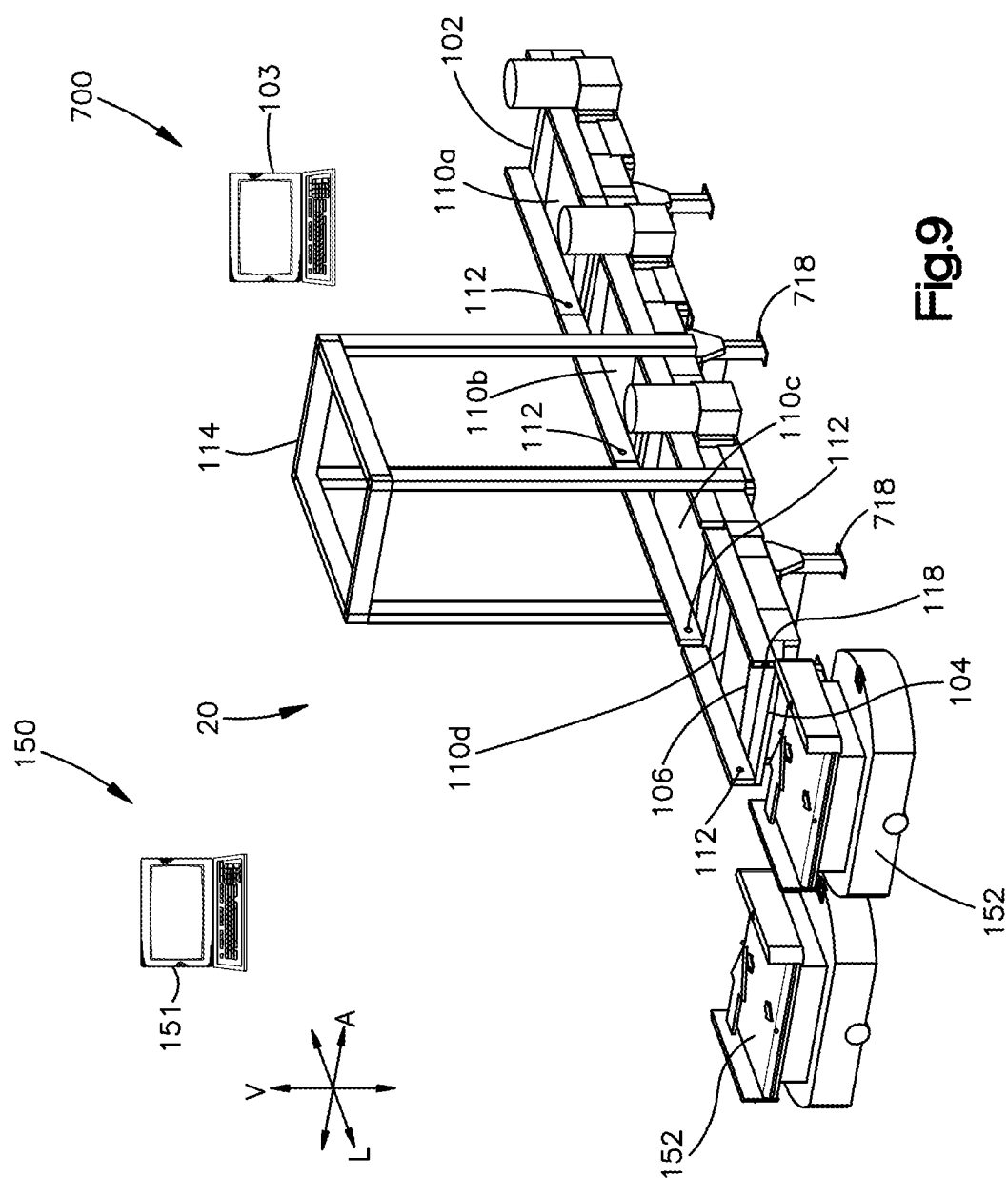
FIG. 9 shows a perspective view of a sortation system according to another embodiment.

Turning now to FIG. 9, a sortation system 20 according to another embodiment is shown in which like reference numerals refer to features that are identical to those of FIG. 1. The block diagram of FIG. 3 can apply equally to the sortation system 20. The sortation system 20 has a mobile drive unit system 150, which can be identical to the mobile drive unit system 150 of FIG. 1. The sortation system 20 can further include a conveyor system 700, which is similar to the conveyor system 100 of FIG. 1. However, the conveyor system 700 has support structure 718 that is configured to support the conveyor surface 106 at a height that is level or just above the surface 126 of the mobile drive units 152 such that the conveyor system 700 is configured to side-load payloads onto the mobile drive units 152. In other words, the sortation system 20 is configured such that the mobile drive units 152 pull up to and stop at the second conveyor end 104, and receive payloads thereon, without traveling under the conveyor surface 106.

Rather than a plurality of sensors 116 positioned under the conveyor surface 106, the conveyor system 700 can include a sensor 118, such as (without limitation) a photo-eye or light curtain, at the second conveyor end 104 that is configured to detect the presence of a mobile drive unit 152 at the second conveyor end 104. The method of operating the conveyor system 700 of FIG. 9 can be similar to the method described above in relation to FIG. 5. However, in step 502, the sensor 118 simply detects a presence of the mobile drive unit 152, rather than a speed of the mobile drive unit 152. Further, in step 504, the conveyor controller 103 turns on the conveyor surface 106 and operates the conveyor surface 106 at a constant speed that matches a speed of the conveyor surface 164 of the mobile drive unit 152. The method of operating the mobile drive unit system 150 can be identical to that described above in relation to FIG. 6.

Figure 10:
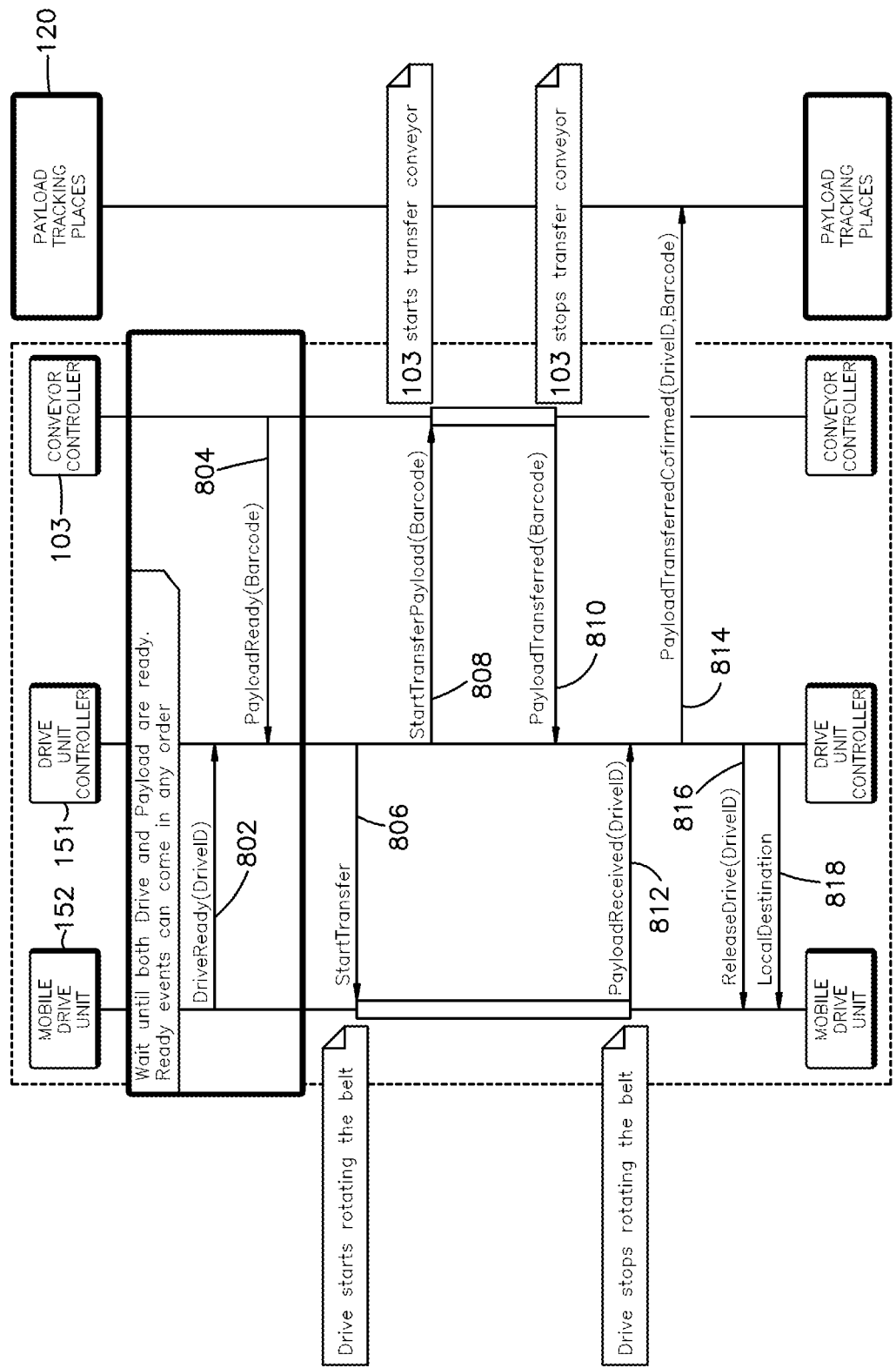
FIG. 10 shows a messaging diagram for the sortation system of FIG. 9 according to one embodiment.

Turning to FIG. 10, a messaging diagram for the system 20 of FIG. 9 is shown according to one embodiment. The sortation system 20 can wait until both a mobile drive unit 152 and a payload are ready for transfer. When a mobile drive unit 152 is positioned at the second conveyor end 104, the sensor 118 of the conveyor system 100 detects the mobile drive unit 152. Either the conveyor controller 103 or the mobile drive unit 152 sends a drive ready signal 802 along with a drive identifier to the drive unit controller 151. When a payload is positioned adjacent the second end 104 of the conveyor 101, the conveyor controller sends a payload ready signal 804 to the drive unit controller 151, along with a payload identifier such as a barcode. As described above, each payload identifier can be a unique identifier that differentiates each payload from the other payloads. Each payload identifier can be a generic identifier that does not include any proprietary information such as customer information or addresses. Thus, it can be said that the local destinations are masked or hidden from the conveyor system 106 by the payload identifiers.

When both a payload and a mobile drive unit 152 are ready, the drive unit controller 151 sends a start transfer signal 806 to the mobile drive unit 152, and the mobile drive unit 152 starts rotating its conveyor surface 164. The drive unit controller 151 then sends a start transfer signal 808 to the conveyor controller 103, and the conveyor controller 103 starts the conveyor surface 106 of the conveyor system 500 at a speed that can be substantially the same as the speed of the conveyor surface 164 of the mobile drive unit 152. Once the payload has been transferred to the mobile drive unit 152, the conveyor controller 103 stops the conveyor surface 106 and sends a payload transferred signal 810 to the drive unit controller 151.

Further, once the sensors 166 of the mobile drive unit 152 detect that the payload has been received, the mobile drive unit 152 stops its conveyor surface 164 and sends a payload received signal 812 to the drive unit controller 151. The drive unit controller 151 sends a payload transfer confirmation signal 814 to a payload tracking software or system 120. Further, the drive unit controller 151 determines a local destination for the mobile drive unit 152, sends a release drive signal 816 and the local destination 818 to the mobile drive unit 152. The mobile drive unit 152 then moves to the local destination and transfers the payload to the local destination.

Because the system 10 of FIG. 1 transfers payloads to the mobile drive units 152 as the mobile drive units 152 are moving, the system 10 can operate with higher throughput than the system 20 of FIG. 9, wherein motion of the mobile drive units 152 is stopped for the transfer of payloads. However, because motion of the mobile drive units 152 is stopped for payload transfer in the system 20 of FIG. 9, coordination of the transfer can be simpler and more reliable than the payload transfer of the system 10 of FIG. 1.

It should be noted that the illustrations and descriptions of the embodiments shown in the figures are for exemplary purposes only, and should not be construed limiting the disclosure. One skilled in the art will appreciate that the present disclosure contemplates various embodiments. Additionally, it should be understood that the concepts described above with the above-described embodiments may be employed alone or in combination with any of the other embodiments described above. It should further be appreciated that the various alternative embodiments described above with respect to one illustrated embodiment can apply to all embodiments as described herein, unless otherwise indicated.

Unless explicitly stated otherwise, each numerical value and range should be interpreted as being approximate as if the word "about" or "approximately" preceded the value or range.

It should be understood that the steps of exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

What is claimed:

1. A sortation system configured to sort payloads at a facility, the sortation system comprising:
a mobile drive unit system comprising a drive unit controller and a plurality of mobile drive units configured to carry the payloads to different local destinations at the facility; and
a conveyor system comprising:
a first conveyor end and a second conveyor end that are offset from one another;
a conveyor surface configured to carry payloads along a direction that extends from the first conveyor end to the second conveyor end, and transfer the payloads to the mobile drive units at the second conveyor end;
a conveyor controller configured to control operation of the conveyor surface; and
a scanner configured to scan barcodes on the payloads to identify a payload identifier for each payload, wherein the payload identifiers are masked such that information about the local destinations such that the local destinations are unknown to the conveyor system,
wherein the conveyor controller is configured to communicate the payload identifiers to the drive unit controller, and the drive unit controller is configured to determine the local destinations from the payload identifiers by unmasking the payload identifiers, and communicate the local destinations to respective mobile drive units.

2. The sortation system of claim 1, wherein the drive unit controller is configured to maintain an association between each mobile drive unit its respective payload.

3. The sortation system of claim 1, wherein the conveyor controller is configured to maintain an association between each mobile drive unit its respective payload.

4. The sortation system of claim 1, wherein the drive unit controller is configured to determine the local destinations by at least one of (i) looking up the local destinations in a table based on the payload identifier, (ii) decoding the payload identifier, and (iii) decrypting the payload identifier.

5. A sortation system configured to sort payloads at a facility, the sortation system comprising:
a mobile drive unit system comprising a plurality of mobile drive units configured to carry the payloads to different local destinations at the facility; and
a conveyor system comprising a conveyor surface configured to transfer the payloads to the mobile drive units,
wherein the conveyor system is configured to communicate a payload identifier for each payload to the mobile drive unit system,
the payload identifiers are masked such that information about the local destinations are unknown to the conveyor system, and
the mobile drive unit system is configured to determine the local destinations from the payload identifiers by unmasking the payload identifiers.

6. The sortation system of claim 5, wherein the conveyor system comprises a scanner configured to scan the payloads to determine the payload identifiers for the payloads.

7. The sortation system of claim 6, wherein each payload includes a barcode, and the scanner is configured to scan the barcode to determine the payload identifiers.

8. The sortation system of claim 5, wherein the mobile drive unit system comprises a drive unit controller configured to maintain an association between each mobile drive unit and its respective payload.

9. The sortation system of claim 8, wherein the mobile drive units are configured to communicate drive identifiers for the mobile drive units to the drive unit controller, the conveyor system is configured to communicate payload identifiers for the payloads to the drive unit controller, and the drive unit controller is configured to associate each payload identifier with a mobile drive unit.

10. The sortation system of claim 5, wherein the conveyor system comprises a conveyor controller configured to maintain an association between each mobile drive unit its respective payload.

11. The sortation system of claim 10, wherein the mobile drive unit system is configured to communicate drive identifiers for the mobile drive units to the conveyor controller, and the conveyor controller is configured to associate each payload identifier with a mobile drive unit.

12. The sortation system of claim 5, wherein the mobile drive unit system is configured to determine the local destinations by at least one of (i) looking up the local destinations in a table based on the payload identifier, (ii) decoding the payload identifier, and (iii) decrypting the payload identifier.

13. A method of sorting payloads at a facility having a conveyor system and a mobile drive unit system, the method comprising:
scanning a payload at the conveyor system to determine a payload identifier for the payload, wherein the payload identifier is masked such that information about the local destinations are unknown to the conveyor system;
transferring the payload and the payload identifier to a mobile drive unit of the mobile drive unit system;
unmasking the payload identifier at the mobile drive unit system to identify a local destination from a plurality of local destinations at the facility; and
causing the mobile drive unit to move the payload to the identified local destination at the facility so as to deliver the payload to the local destination.

14. The method of claim 13, wherein the scanning step comprises the conveyor system scanning a barcode on the payload to determine the payload identifier.

15. The method of claim 13, wherein the transferring step comprises creating an association between the payload and the mobile drive unit.

16. The method of claim 15, wherein the transferring step comprises creating, at a drive unit controller of the mobile drive unit system, the association between the mobile drive unit and the payload.

17. The method of claim 16, wherein the transferring step comprises the mobile drive unit communicating a drive identifier for the mobile drive unit to the drive unit controller, the conveyor system communicating the payload identifier to the drive unit controller, and the drive unit controller associating the payload identifier with the mobile drive unit.

18. The method of claim 15, wherein the transferring step comprises creating, at a conveyor controller of the conveyor system, the association between the mobile drive unit and the payload.

19. The method of claim 18, wherein the transferring step comprises the mobile drive unit system communicating a drive identifier for the mobile drive unit to the conveyor controller, and the conveyor controller associating the payload identifier with the mobile drive unit.

20. The method of claim 13, wherein the unmasking step comprises the mobile drive unit system determining the local destination by at least one of (i) looking up the local destinations in a table based on the payload identifier, (ii) decoding the payload identifier, and (iii) decrypting the payload identifier.

* * * * *